United States Patent
Horiuchi

(10) Patent No.: US 9,205,698 B2
(45) Date of Patent: Dec. 8, 2015

(54) METHOD FOR FORMING THROUGH-HOLE IN INSULATING SUBSTRATE BY USING LASER BEAM

(71) Applicant: ASAHI GLASS COMPANY, LIMITED, Tokyo (JP)

(72) Inventor: Kohei Horiuchi, Tokyo (JP)

(73) Assignee: ASAHI GLASS COMPANY, LIMITED, Tokyo (JP)

( * ) Notice: Subject to any disclaimer, the term of this patent is extended or adjusted under 35 U.S.C. 154(b) by 0 days.

(21) Appl. No.: 14/481,572

(22) Filed: Sep. 9, 2014

(65) Prior Publication Data

US 2015/0076113 A1 Mar. 19, 2015

(30) Foreign Application Priority Data

Sep. 13, 2013 (JP) ................................. 2013-191057

(51) Int. Cl.
*B44C 1/22* (2006.01)
(52) U.S. Cl.
CPC ...................................... *B44C 1/228* (2013.01)
(58) Field of Classification Search
None
See application file for complete search history.

(56) References Cited

U.S. PATENT DOCUMENTS

| | | | |
|---|---|---|---|
| 5,493,096 A | 2/1996 | Koh | |
| 8,134,681 B2 * | 3/2012 | Okita | 355/27 |
| 8,373,845 B2 * | 2/2013 | Fujisawa | 355/55 |
| 8,681,314 B2 * | 3/2014 | Ebihara et al. | 355/72 |
| 2002/0039845 A1 * | 4/2002 | Yoshimura | 438/784 |
| 2003/0147059 A1 * | 8/2003 | Tokuda et al. | 355/53 |
| 2004/0266207 A1 * | 12/2004 | Sirringhauss et al. | 438/725 |
| 2007/0058146 A1 * | 3/2007 | Yamaguchi | 355/53 |
| 2010/0112890 A1 * | 5/2010 | Ito et al. | 445/44 |

* cited by examiner

*Primary Examiner* — Allan Olsen
(74) *Attorney, Agent, or Firm* — Foley & Lardner LLP

(57) ABSTRACT

A method including a) forming a through-hole in a dummy substrate including a surface by radiating a laser to the surface of the dummy substrate in a state where the dummy substrate is moved relative to the laser along a direction parallel to the surface of the dummy substrate, b) determining an angle $\alpha$ ($-90°<\alpha<+90°$) of the through-hole relative to a line perpendicular to the surface of the dummy substrate, and c) forming a through-hole in the insulating substrate with the same conditions as step a) except for radiating a laser at an angle $\beta$ relative to a line perpendicular to a surface of the insulating substrate. The angle $\beta$ is set to be line symmetric with the angle $\alpha$ relative to the line perpendicular to the surface of the insulating substrate and satisfy a relationship of $\beta=-\alpha$.

5 Claims, 7 Drawing Sheets

METHOD FOR FORMING THROUGH-HOLE IN INSULATING SUBSTRATE BY USING LASER BEAM

CROSS-REFERENCE TO RELATED APPLICATION

This application claims priority to Japanese Patent Application No. 2013-191057, filed on Sep. 13, 2013, which is hereby incorporated by reference in its entirety.

BACKGROUND OF THE INVENTION

1. Field of the Invention

The present invention generally relates to a method for forming a through-hole in an insulating substrate by using a laser beam.

2. Description of the Related Art

Conventionally, there is a method of forming a through-hole in an insulating substrate by radiating a laser beam from a laser source to the insulating substrate (see Patent Document 1).

Patent Document 1 U.S. Pat. No. 5,493,096

Typically, in a case of forming multiple through-holes in an insulating substrate by using a laser beam, the following steps are repeated.

1) Move a process target (i.e. insulating substrate) to a predetermined position relative to a laser beam, and stop the insulating substrate at predetermined position;
2) Form a first through-hole in a first radiation area of the insulating substrate by radiating the laser beam;
3) Stop the radiation of the laser beam;
4) Move the insulating substrate to another position relative to the laser beam; and
5) Form a second through-hole in a second radiation area of the insulating substrate by radiating the laser beam.

However, with the method using the above-described steps, the insulating substrate is required to be moved from one position to another position relative to the laser beam whenever another through-hole is to be formed (processed). Therefore, this method requires a large amount of time to form multiple through-holes and degrades the efficiency of processing multiple through-holes.

SUMMARY OF THE INVENTION

The present invention may provide a method for forming a through-hole in an insulating substrate by using a laser beam that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a method for forming a through-hole in an insulating substrate by using a laser beam particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a method for forming multiple through-holes in an insulating substrate, the method including the steps of: a) forming a through-hole in a dummy insulating substrate including a first surface by radiating a laser beam to the first surface of the dummy insulating substrate in a state where the dummy insulating substrate is moved relative to the laser beam along a direction parallel to the first surface of the dummy insulating substrate; b) determining an inclination angle $\alpha$ ($-90°<\alpha<+90°$) of the through-hole relative to a line that is perpendicular to the first surface of the dummy insulating substrate; and c) forming a through-hole in the insulating substrate with the same conditions as step a) except for radiating a laser beam at an angle $\beta$ relative to a line that is perpendicular to a first surface of the insulating substrate, wherein the angle $\beta$ is set to be line symmetric with the inclination angle $\alpha$ relative to the line perpendicular to the first surface of the insulating substrate and satisfy a relationship of $\beta=-\alpha$.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

(Through-Hole Forming Method of Related Art)

First, a method for forming a through-hole of a related art example is described with reference to FIG. 1.

Figure 1:
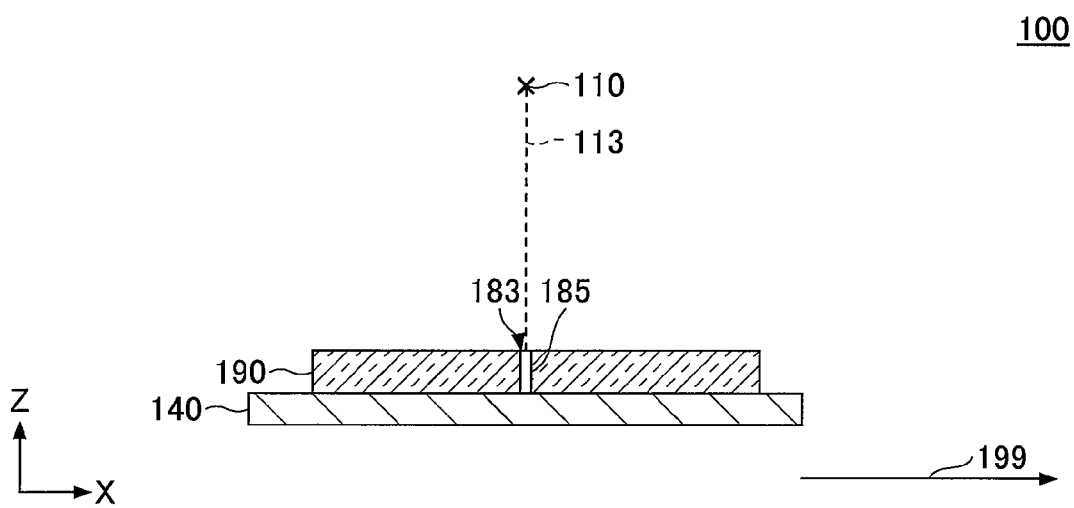
FIG. 1 is a schematic diagram illustrating a configuration of a through-hole processing apparatus used for performing a through-hole forming method according to a related art example.

FIG. 1 is a schematic diagram illustrating a configuration of a through-hole processing apparatus used for performing a through-hole forming method according to a related art example.

As illustrated in FIG. 1, the through-hole processing apparatus 100 includes a laser source 110 and a stage 140.

An insulating substrate 190, which is a process target, is placed on an upper part of the stage 140. The stage 140 is used for adjusting the position of the insulating substrate 190 relative to a laser beam 113 radiated from a laser source 110. The stage 140 can be moved in a horizontal direction (XY direction).

In a case of forming multiple through-holes in the insulating substrate 190 by using the through-hole processing apparatus 100, first, the insulating substrate 190 is placed on the stage 140. Then, the insulating substrate 190 is moved to a predetermined position (first position) by moving the stage 140 in a horizontal direction (XY direction.

Then, the laser beam 113 is radiated from the laser source 110 to the insulating substrate 190. Thereby, an area 183 in the insulating substrate 190 that is radiated by the laser beam 113 (hereinafter referred to as "radiated area 183") is locally heated to a predetermined temperature, so that an insulating material of the radiated area 183 is sublimed. Accordingly, a first through-hole 185 is formed. Then, the radiation of the laser beam 113 is stopped.

Then, the insulating substrate 190 is moved to another position (second position) by moving the stage 140. For example, the stage 140 is moved a predetermined distance in the X direction as illustrated with an arrow 199 (hereinafter also referred to as "movement direction 199") of FIG. 1.

Then, after the stage 140 is completely stopped, the laser beam 113 is radiated again to the insulating substrate 190. Accordingly, a second through-hole 185 is formed.

By repeating the above-described steps, multiple through-holes 185 can be formed in the insulating substrate 190.

The above-described method of the related art example is referred to as a "stop & go method". With the stop & go method, the insulating substrate 190 is required to be shifted to another position relative to the laser beam 113 by using the stage 140 and radiated by the laser beam at the other position whenever another through-hole. Accordingly, the stop & go method requires to repeat the processes of quickly moving the stage 140 and quickly stopping the stage 140. Thus, the stop & go method requires a large amount of time, particularly for moving the stage 140 and leads to degradation of process efficiency.

The following example describes a case of using the stop & go method to form 100 through-holes in the insulating substrate 190 at a pitch of 200 g m along the movement direction 199.

Typically, after the forming of the first through-hole 185 is completed, the insulating substrate 190 is moved to another position (in this case, a position shifted 200 µm in the X direction) and prepared for forming the second through-hole 185. The time between the completion of the forming of the first through-hole 185 and the completion of the preparation for forming the second through-hole 185 is approximately 200 ms (milliseconds). Thus, in this case, an estimated time of at least 20 seconds (200 ms×100) is required for forming 100 through-holes 185 along the insulating substrate 190 in the X-direction.

In an actual process, through-holes are to be arranged to form a two-dimensional pattern in the YX directions. Therefore, the above-described processes are also to be performed with respect to Y coordinates for completing the forming of the through-holes. Therefore, a significant amount of process time is required to form the through-holes.

As a result of conducting research and development for resolving the problems pertaining to the process time required by the stop & go method, the inventor of the present invention has conceived a method that can significantly shorten the time for processing through-holes. This method, which is hereinafter referred to as a "non-stop moving method", can process through-holes by radiating a laser beam to an insulating substrate while moving the insulating substrate (i.e. performing laser radiation without having to stop the insulating substrate).

Next, the following example describes a case of using the non-stop moving method to form 100 through-holes in an insulating substrate at a pitch of 200 µm along the movement direction 199.

For example, assuming that the insulating substrate is moved at a rate of 3000 µm/sec, the process time required to form 100 through-holes is 6.6 seconds (200 (µm)×99/3000 (µm/sec)). Accordingly, the process time for forming the through-holes can be reduced to approximately 33% in comparison to the process time using the stop & go method.

Therefore, the process time for forming multiple through-holes can be significantly shortened by using the non-stop moving method.

However, in a case where the insulating substrate is moved while being radiated by the laser beam, the shape of the through-hole formed in the insulating substrate cannot be parallel to the thickness direction of the insulating substrate. That is, the through-hole is inclined (slanted) relative to the thickness direction of the insulating substrate.

Figure 2:
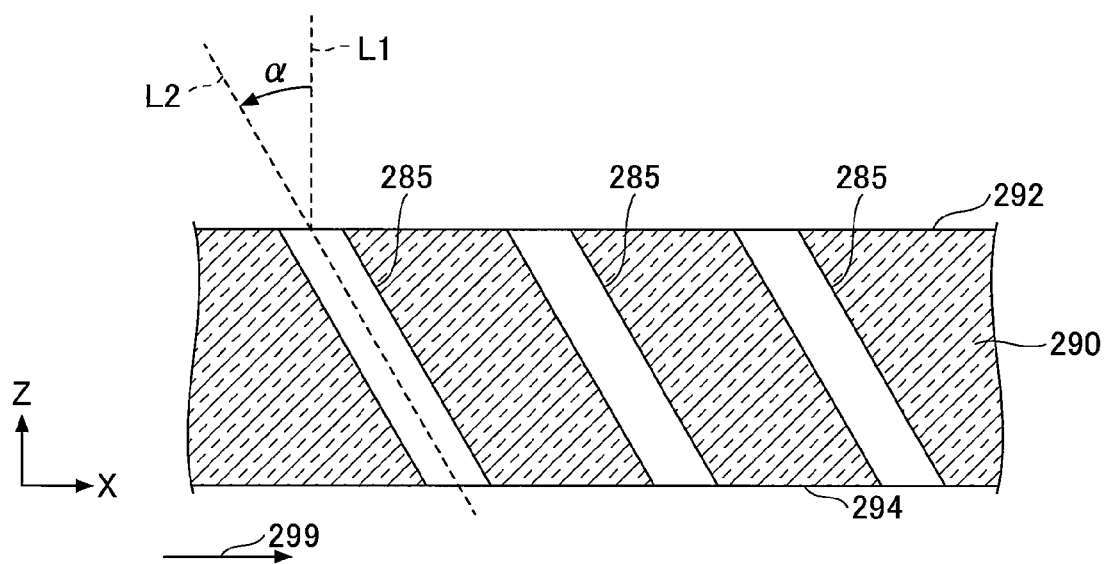
FIG. 2 is a cross-sectional view illustrating through-holes obtained by radiating a laser beam along a direction perpendicular to an insulating substrate while moving the insulating substrate in a horizontal direction (X direction) relative to the laser beam.

FIG. 2 is a cross-sectional view illustrating through-holes obtained by radiating a laser beam along a direction perpendicular to an insulating substrate while moving the insulating substrate in a horizontal direction (X direction) relative to the laser beam.

In FIG. 2, an insulating substrate 290 includes a first surface 292 and a second surface 294. Further, a laser beam is radiated to the insulating substrate 290 from the side of the first surface 292 along a vertical direction relative to the insulating substrate 290. Further, the insulating substrate 290 is moved at a constant rate in a direction illustrated with an arrow 299 (hereinafter also referred to as "movement direction 299") of FIG. 2 during the radiation of the laser beam.

As illustrated in FIG. 2, the through-hole 285 formed in the insulating substrate 290 is an inclined through-hole that is inclined relative to a line L1 perpendicular to the first surface 292 of the insulating substrate 290.

It is to be noted that the term "inclination α" refers to an angle that is formed by a center line L2 of the inclined through-hole 285 and the perpendicular line L1. The inclination angle α may have a positive value or a negative value and range from $-90°<\alpha<90°$. That is, in a case where the perpendicular line L1 is defined to be angle 0, the inclination angle α is expressed with a positive value when the center line L2 is inclined toward a positive side of the movement direction 299 relative to the perpendicular line L1 whereas the inclination angle α expressed with a negative value when the center line L2 is inclined toward a negative side of the movement direction 299 relative to the perpendicular line L1. In the example of FIG. 2, the inclination angle α has a negative value.

In the case of using the non-stop moving method, the through-hole 285 inclined relative to the perpendicular line L1 is formed. Therefore, in order to achieve practically use of the non-stop moving method, it is necessary to form a perpendicular through-hole similar to the through-hole 185 formed by using the stop & go method instead of forming the inclined through-hole 285.

In view of the above, the inventor of the present invention has conceived a method that allows a through-hole to be formed with an inclination angle α of substantially 0 degrees even in the case of using the non-stop moving method by selecting appropriate conditions for processing the through-hole.

With this method, it is theoretically possible to form a perpendicular through-hole even in a case of using the non-stop moving method by applying a condition of forming a through-hole having an angle α' (α'=−α) that is formed when processing the through-hole in a state where an insulating substrate is stopped (stopped state). In other words, by deliberately selecting a condition to form a through-hole having an angle α' (α'=−α) that is formed when processing the through-hole in the stopped state, the inclination angle α formed by using the non-stop moving method would be canceled out by the angle α'. As a result, a substantially perpendicular through-hole can be formed.

For example, by tilting the radiation direction of the laser beam to form an angle β (β=−α) relative to the perpendicular line L1 (i.e. line perpendicular to the insulating substrate 290) when processing the through-hole using the non-stop moving method, a substantially perpendicular through-hole can be formed by using the non-stop moving method.

Accordingly, with the below-described embodiments of the present invention, a substantially perpendicular through-hole can be formed while shortening the process time compared to the related art. Therefore, the efficiency of processing through-holes is improved.

Further, with the stop & go method of the related art, the distance of a single move between the position of forming the first through-hole in the insulating substrate 190 (first through-hole forming position) and the position of forming the second through-hole in the insulating substrate 190 (second through-hole forming position) is a significantly short distance that is equivalent to the pitch of the through-holes (e.g., 200 μm). In other words, the distance in which the insulating substrate 190 is moved from the first through-hole forming position to the second through-hole forming position is significantly short. Therefore, it is extremely difficult to move the insulating substrate 190 at a constant rate. In addition, a large amount of acceleration is to be applied to the insulating substrate 190 at the time of starting or stopping the movement of the insulating substrate 190. This may cause the insulating substrate 190 to deviate from the stage 140 or a predetermined position relative to the laser beam 113 during the processing of forming the through-holes. As a result, the accuracy of the position of the through-hole may be degraded. Further, additional components or the like may be required to solve such problems (e.g., a fixing component for firmly fixing the insulating substrate 190 to the stage 140).

In contrast, because the below-described embodiments of the present invention use the non-stop moving method in which an insulating substrate can be moved for a relatively long distance at a constant rate, the amount of acceleration applied to the insulating substrate can be significantly reduced. As a result, through-holes can be accurately for in predetermined positions without any additional components or the like.

<Method for Forming Through-Hole According to First Embodiment>

A method for forming a through-hole according to a first embodiment of the present invention (first through-hole forming method) is described with reference to FIGS. 3-5.

Figure 3:
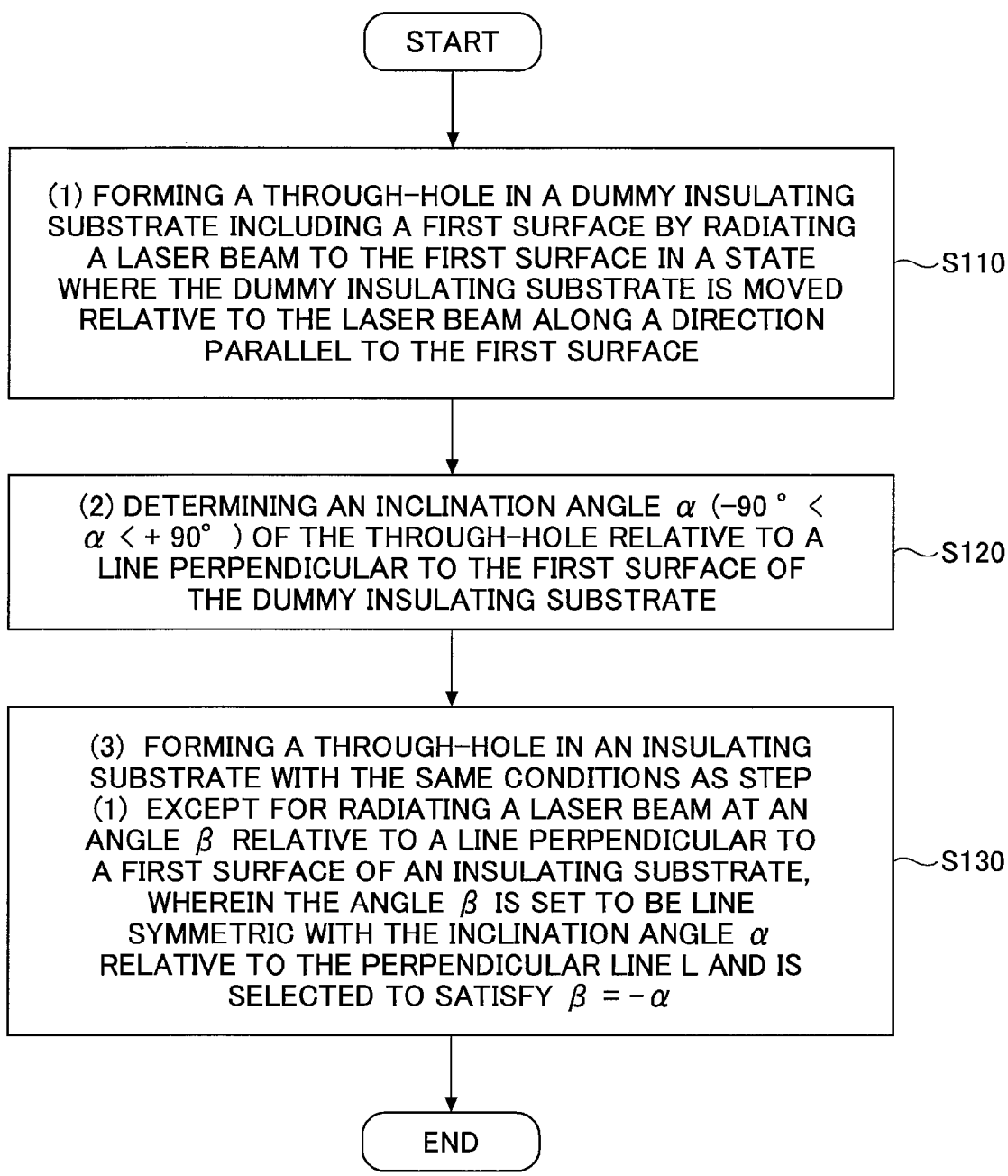
FIG. 3 is a flowchart of a method for forming a first through-hole (first through-hole forming method) according to an embodiment of the present invention.

FIG. 3 is a flowchart of the first through-hole forming method. FIGS. 4 and 5 are schematic diagrams for describing a step performed in the first through-hole forming method by using a through-hole processing apparatus according to an embodiment of the present invention.

As illustrated in FIG. 3, the first through-hole forming method includes the steps of:

(1) Forming a through-hole in a dummy insulating substrate including a first surface by radiating a laser beam to the first surface in a state where the dummy insulating substrate is moved relative to the laser beam along a direction parallel to the first surface (Step S110);

(2) Determining an inclination angle α (−90°<α<+90°) of the through-hole relative to a perpendicular line that is perpendicular to the first surface of the dummy insulating substrate (Step S120); and (3) Forming a through-hole in an insulating substrate with the same conditions as step (1) except for radiating a laser beam at an angle β relative to a line perpendicular to a first surface of an insulating substrate, wherein the angle β is set to be line symmetric with the inclination angle α relative to the perpendicular line L and to satisfy a relationship of β=−α (Step S130).

Next, each of the steps illustrated in FIG. 3 is described in detail with reference to FIGS. 4 and 5.

<Step S110>

First, a through-hole is formed in a dummy substrate by using the non-stop moving method (dummy substrate processing step).

Figure 4:
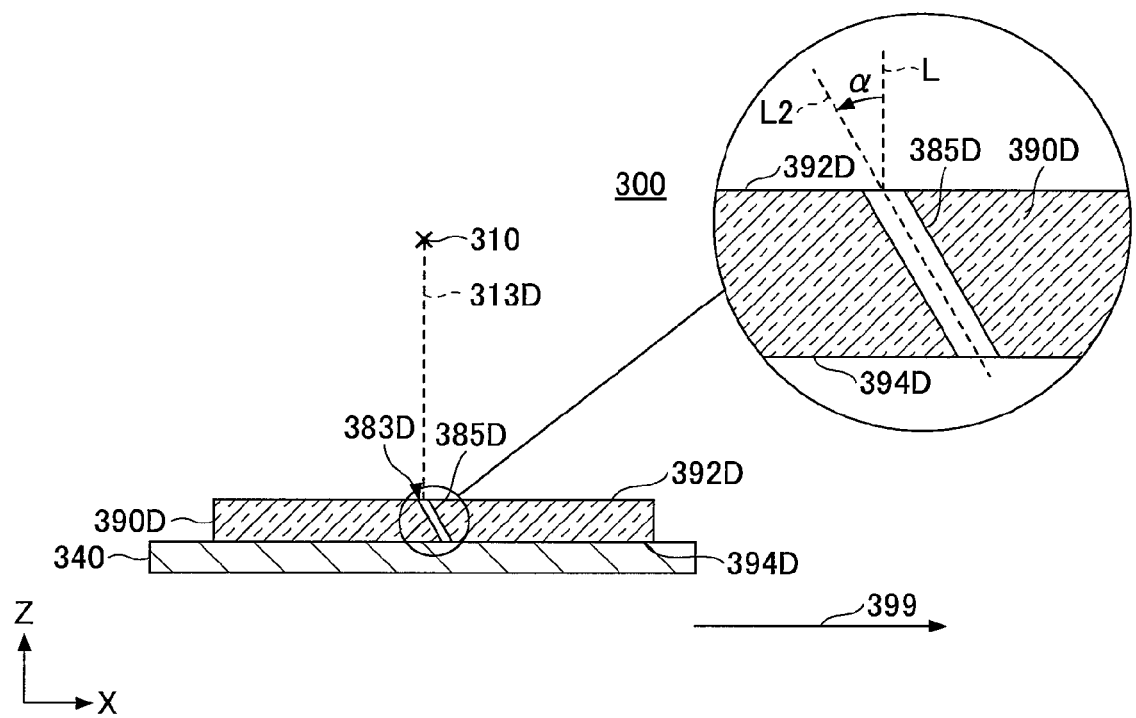
FIG. 4 is a schematic diagram for describing a step performed in the first through-hole forming method by using a through-hole processing apparatus according to an embodiment of the present invention.

FIG. 4 illustrates an example of a through-hole processing apparatus 300 used in Step S110.

As illustrated in FIG. 4, the through-hole processing apparatus 300 includes a laser source 310 and a stage 340.

A dummy insulating substrate 390D is placed on an upper part of the stage 340. The stage 340 is used for adjusting the position of the dummy insulating substrate 390D relative to a laser beam 313D radiated from the laser source 310. The stage 340 can be moved in a direction indicated with an arrow 399 (hereinafter also referred to as "movement direction 399") in FIG. 4.

The dummy insulating substrate 390D includes a first surface 392D and a second surface 394D. The dummy insulating substrate 390D is placed on the stage 340 in a manner that the side of the first surface 392D is positioned closer to the laser source 310 than the side of the second surface 394D.

The dummy insulating substrate 390D has the same composition and same dimension (especially thickness) as the below-described insulating substrate 390T.

For example, the dummy insulating substrate 390D may be a glass substrate. Further, the dummy insulating substrate 390D may have a thickness that ranges from 0.05 mm to 0.7 mm. The less the thickness of the dummy insulating substrate 390D is, the below-described through-hole can be formed with a small deviation amount between its upper and lower holes in the below-described Step S130 even in a case where the inclination angle α of the through-hole is constant.

In a case of forming a through-hole in the dummy insulating substrate 390D by using the through-hole processing apparatus 300, the stage 340 is moved in the movement direction 399 at a constant rate. Accordingly, the dummy insulating substrate 390D is also moved in the movement direction 399. Although the moving rate of the stage 340 is not limited in particular, the moving rate of the stage 340 may range, for example, from 0.1 mm/sec to 500 mm/sec.

Then, the laser beam 313D is radiated to a radiation area 383D of the dummy insulating substrate 390D from the laser source 310 while the dummy insulating substrate 390D is being moved. It is to be noted that, the position of the radiation area 383 usually changes in a depth direction of the dummy insulating substrate 390D because the dummy insulating substrate 390D is moving during the laser radiation.

The radiation time of the laser beam 313D may range, for example, from 50 μs to 1000 μs. Alternatively, the radiation time of the laser beam 313D may range, for example, from 80 μs to 800 μs. Further, the radiation power of the laser beam 313D may range, for example, from 1 W to 400 W. Alternatively, the radiation power of the laser beam 313D may range, for example, from 10 W to 200 W. The inclination angle α of the through-hole becomes smaller as the power of the laser beam 313D becomes larger and the radiation time of the laser beam 313D becomes shorter.

It is to be noted that a radiation angle γ formed by the radiation direction of the laser beam 313D and a perpendicular line perpendicular to the dummy insulating substrate 390D is not limited in particular. For example, the radiation angle γ of the laser beam 313D may range, for example, from 0° to ±20°. The definition of the radiation angle γ of the laser beam 313D is basically based upon the above-described definition of the inclination angle α explained with FIG. 2.

It is, however, preferable for the laser beam 313D to be radiated substantially perpendicular to the first surface 392D of the dummy insulating substrate 390D as illustrated in FIG. 4 (i.e. radiation angle γ=0). By radiating the laser beam 313D to be substantially perpendicular to the first surface 392D of the dummy insulating substrate 390D, a through-hole can usually be formed with a small inclination angle α.

Thereby, the radiation area 383D of the dummy insulating substrate 390D is heated and melted. As a result, a through-hole (inclined through-hole) 385D having an inclination angle α can be formed in the dummy insulating substrate 390D (see circled part in FIG. 4).

Although not illustrated in FIG. 4, multiple through-holes 385D may be formed in the dummy insulating substrate 390D along the movement direction 399.

<Step S120>

Then, the inclination angle α of the through-hole 385D is determined based on the processed dummy insulating substrate 390D. The inclination angle α of the through-hole 385D can be determined by performing, for example, observation of the cross section of a part of the dummy insulating substrate 390D corresponding to the through-hole 385D.

Theoretically, the inclination angle α of the through-hole 385D may be any value that is greater than −90° but less than +90°.

It is, however, preferable to form the through-hole 385D having an inclination angle α ranging, for example, from −10° to +10° by selecting an appropriate condition(s) for processing the through-hole in Step S110. For example, the through-hole 385D may be formed having an inclination angle α ranging, for example, from −5° to +5°. Particularly, the through-hole 385D can be formed having an inclination angle α of substantially 0° depending on the condition selected for processing the through-hole 385D.

It is to be noted that, in a case where a thick insulating substrate is used as an insulating substrate 390T in the following Step S130, a through-hole 385T may be formed in a predetermined position of the insulating substrate 390T with less accuracy when the inclination angle α of the through-hole 385D is less than −10° or greater than +10°.

<Step S130>

Then, a through-hole is formed in an actual process target by using the non-stop moving method (Actual processing step).

In performing the actual processing step, the through-hole processing apparatus 300 (see FIG. 4) used in Step S110 is used.

It is, however, to be noted that a radiation angle β formed by a laser beam 313T radiated from the laser source 310 is different from the radiation angle γ of Step S110.

Figure 5:
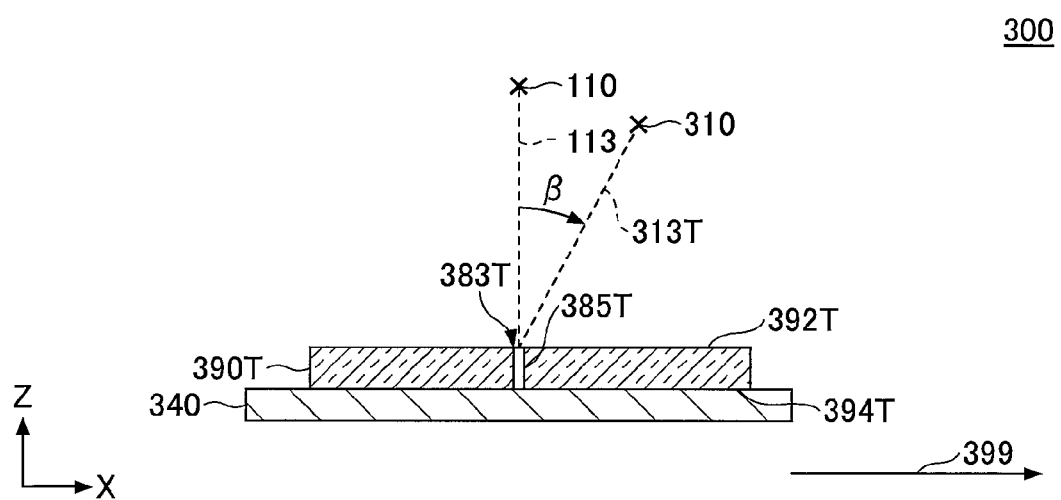
FIG. 5 is a schematic diagram for describing a step performed in the first through-hole forming method by using a through-hole processing apparatus according to an embodiment of the present invention.

FIG. 5 illustrates an example of using the through-hole processing apparatus 300 in Step S130. As illustrated in the actual processing step of FIG. 5, an insulating substrate 390T, which is an actual process target (e.g., product), is placed on an upper part of the stage 340. The insulating substrate 390T includes a first surface 392T and a second surface 394T. The insulating substrate 390T is placed on the stage 340 in a manner that the side of the first surface 392T is positioned closer to the laser source 310 than the side of the second surface 394T.

The insulating substrate 390T has the same composition and same dimension (especially thickness) as the above-described insulating substrate 390D.

For example, the insulating substrate 390T may be a glass substrate. Further, the insulating substrate 390T may have a thickness that ranges from 0.05 mm to 0.7 mm.

After the insulating substrate 390T is placed on the stage 340, the stage 340 is moved along the movement direction 399 at a constant rate. Thereby, the insulating substrate 390T is also moved in the movement direction 399. The moving rate of the insulating substrate 390T is substantially the same as the moving rate of the dummy insulating substrate 390D of Step S310.

Then, a laser beam 313T is radiated to a radiation area 383T of the insulating substrate 390T from the laser source 310 while the insulating substrate 390T is being moved. It is to be noted that, the position of the radiation area 383T may change in a depth direction of the insulating substrate 390T because the insulating substrate 390T is moving during the laser radiation.

Thereby, the radiation area 383T of the insulating substrate 390T is heated and melted. As a result, a through-hole 385T can be formed in the insulating substrate 390T.

The time and power for radiating the laser beam 313T is substantially the same as radiation time and radiation power used in Step S110.

Further, the radiation angle β of the laser beam 313T relative to the insulating substrate 390T is determined based on the inclination angle α of the through-hole 385D determined in Step S120. More specifically, the radiation angle β of the laser beam 313T relative to the insulating substrate 390T is selected to satisfy a relationship of β=−α.

Thereby, the insulating substrate 390T can be formed having a substantially perpendicular through-hole 395T.

<Method for Forming Through-Hole According to Second Embodiment>

A method for forming a through-hole according to the second embodiment of the present invention (second through-hole forming method) is described with reference to FIGS. 6-7.

Figure 6:
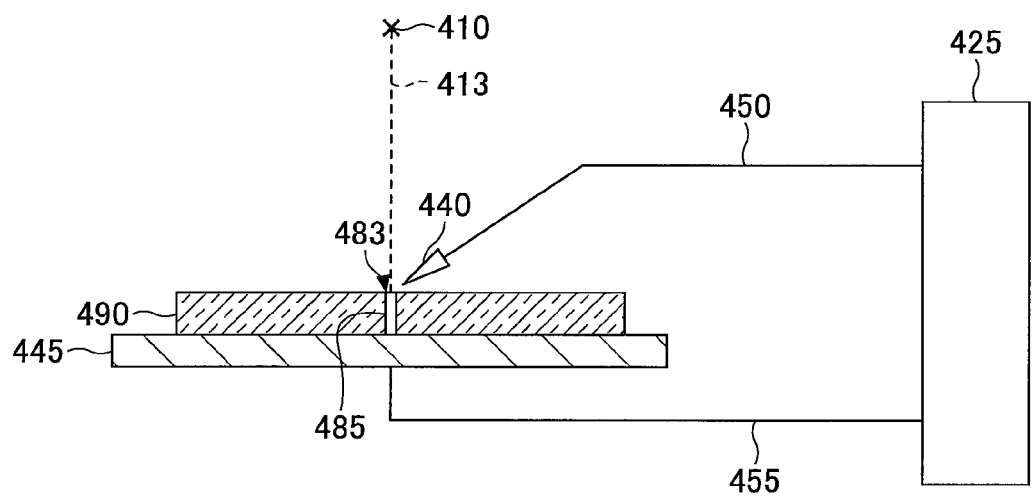
FIG. 6 is a schematic diagram illustrating a configuration of a through-hole processing apparatus that may be used in a method for forming a second through-hole (second through-hole forming method) according to an embodiment of the present invention.

FIG. 6 is a schematic diagram illustrating a configuration of a through-hole processing apparatus that may be used in the second through-hole forming method. FIG. 7 is a flowchart of the second through-hole forming method.

First, a through-hole processing apparatus 400 that may be used to perform the second through-hole forming method is described with reference to FIG. 6.

The through-hole processing apparatus 400 is an apparatus used for performing, for example, an auxiliary laser discharge process.

It is to be noted that "auxiliary laser discharge process" is a generic term to indicate the below-described method for adjusting the shape of a through-hole in which the shape of the through-hole is adjusted by using a discharging phenomenon created between a first electrode and a second electrode after forming the through-hole in a glass substrate by laser radiation.

As illustrated in FIG. 6, the through-hole processing apparatus 400 includes a laser source 410, a high voltage direct current source 425, a first electrode 440, and a second electrode 445.

The first and second electrodes 440, 445 are electrically connected to conductors 450, 455, respectively. The conductors 450, 455 are connected to the high voltage direct current source 425.

In the example illustrated in FIG. 6, the first and second electrodes 440, 445 are shaped and positioned differently. That is, the first electrode 440 has a needle-like shape whereas the second electrode 440 has a plate-like shape. Further, the first electrode 440 is positioned apart from the insulating substrate 490 whereas the second electrode 445 is positioned directly below and in contact with the insulating substrate 490. The second electrode 445 functions as a stage that carries and conveys the insulating substrate 490.

However, the through-hole processing apparatus 400 illustrated in FIG. 6 is merely one example. For example, the second electrode 445 may be positioned apart from the insulating substrate 490 at the bottom side of the insulating substrate 490. The second electrode 445 and a stage may be formed as independent components and separated from each other. Further, the second electrode 445 may have the same needle-like shape as the first electrode 440. In this case, a pair of electrodes may be formed by the first electrode 440, the second electrode 445 facing the first electrode 440, and the insulating substrate (e.g., glass substrate) 490 sandwiched between the first and second electrodes 440, 445.

Typically, in a case of forming a through-hole in the insulating substrate 490 by using the through-hole processing apparatus 400, the insulating substrate 490 is positioned between the first and second electrodes 440, 445. Further, the insulating substrate 490 is arranged at a predetermined position by moving the second electrode 445 (or a separate stage) in the horizontal direction.

Then, the laser beam 413 is radiated to the insulating substrate 490 from the laser source 410. Thereby, an area 483 in the insulating substrate 490 that is radiated by the laser beam 413 (hereinafter referred to as "radiated area 483") is locally heated to a predetermined temperature, so that an insulating material of the radiated area 483 is sublimed. Accordingly, a first through-hole 485 is formed.

After forming the first through-hole 485, a high voltage direct current is applied between the first and second electrodes 440, 445 by using the high voltage direct current source 425. Thereby, discharge occurs between the first and second electrodes 440, 445. This is because the resistances at other parts are low.

By the discharge generated by the first and second electrodes 440, 445, the shape of the first through-hole 485 is adjusted. Thereby, the first through-hole can be formed with dimensions of greater accuracy.

Then, the insulating substrate 490 is arranged at a predetermined position by moving the second electrode 445 (or a separate stage) in the horizontal direction. Then, a second through-hole is formed by performing a process similar to the above-described step of forming the first through-hole 485.

By repeating the above-described steps, multiple through-holes are formed in the insulating substrate 490.

Figure 7:
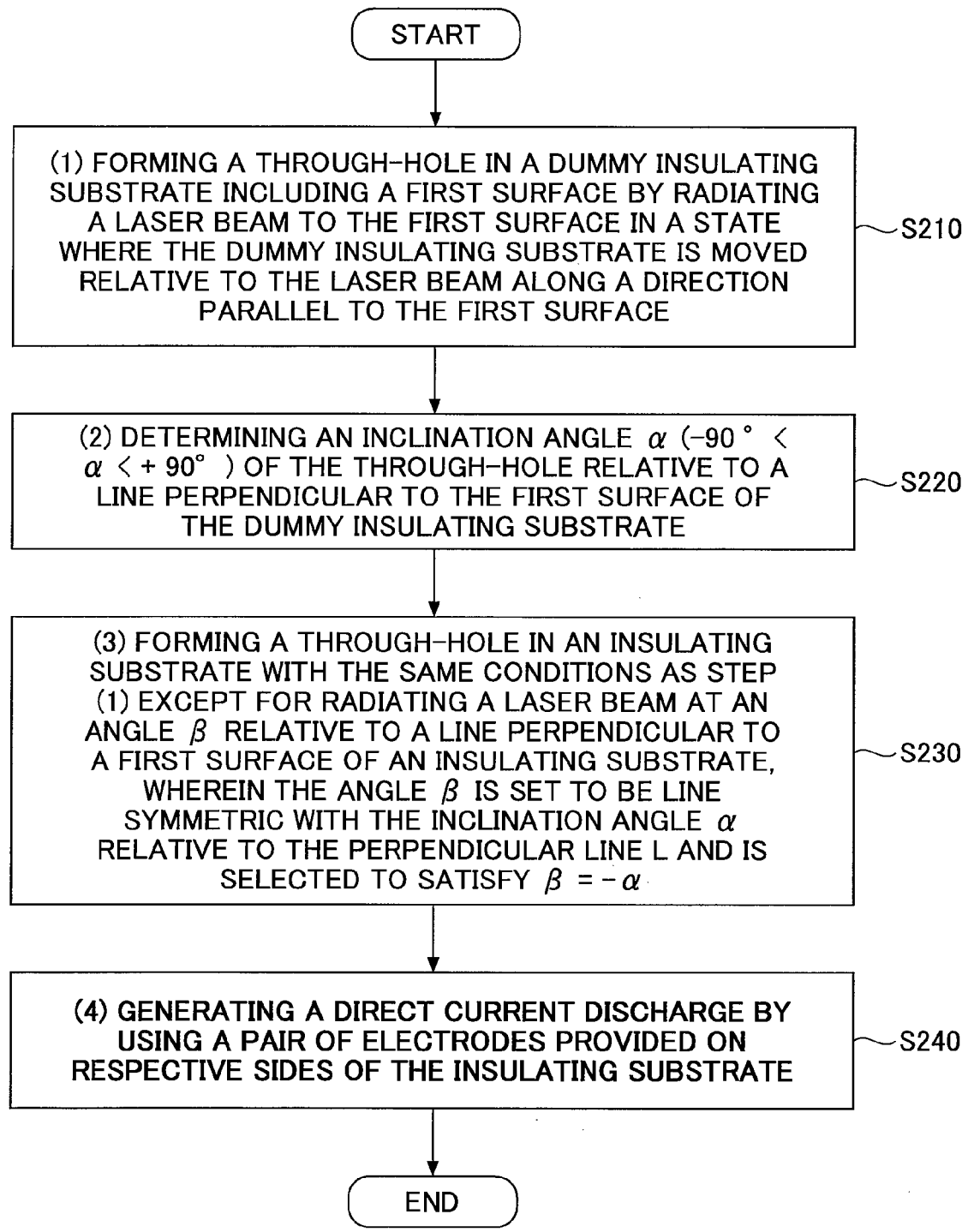
FIG. 7 is a flowchart of the second through-hole forming method according to an embodiment of the present invention.

FIG. 7 is a flowchart of the second through-hole forming method that is performed by using, for example, the above-described through-hole processing apparatus 400.

As illustrated in FIG. 7, the second through-hole forming method includes the steps of:

(1) Forming a through-hole in a dummy insulating substrate including a first surface by radiating a laser beam to the first surface in a state where the dummy insulating substrate is moved relative to the laser beam along a direction parallel to the first surface (Step S210);

(2) Determining an inclination angle $\alpha$ ($-90°<\alpha<+90°$) of the through-hole relative to a perpendicular line that is perpendicular to the first surface of the dummy insulating substrate (Step S220);

(3) Forming a through-hole in an insulating substrate with the same conditions as step (1) except for radiating a laser beam at an angle $\alpha$ relative to a line perpendicular to a first surface of an insulating substrate, wherein the angle $\beta$ is set to be line symmetric with the inclination angle $\alpha$ relative to the perpendicular line L and to satisfy a relationship of $\beta=-\alpha$ (Step S230); and (4) Generating a direct current discharge by using a pair of electrodes provided on respective sides of the insulating substrate.

Among the steps of the second through-hole forming method, Steps S210-S230 are the same as Steps S110-S130 of the first through-hole forming method. Therefore, only Step S240 is described below.

<Step S240>

Next, a process of performing Step S240 by using the through-hole processing apparatus 400 of FIG. 6 is described.

In Step S240, a high voltage direct current is applied between the first electrode 440 and the second electrode 445 by using the high voltage direct current source 425. Thereby, discharge occurs between the first and second electrodes 440, 445 via the through-hole 485.

Because the second through-hole forming method also uses the non-stop moving method in the actual processing step, the discharging process of Step S240 is also performed while the insulating substrate 290 is being moved.

However, the discharge time of Step S240 is extremely short (i.e. performed in the order of μs). Therefore, the moving rate of the insulating substrate 490 hardly affects the discharge. That is, the discharge behavior during the moving of the insulating substrate 290 and the through-hole after the discharge are substantially the same as a case of performing the discharging process in a state where the insulating substrate 490 is stopped.

Therefore, the through-hole having its inclination angle $\alpha$ determined in Step S220 may be a through-hole subjected to the discharging process or a through-hole that is not yet subjected to the discharging process.

Accordingly, with the second through-hole forming method, the radiation angle $\beta$ of the laser beam 313T relative to the insulating substrate 390T is determined based on the inclination angle $\alpha$ of the through-hole 385D determined in Step S220. That is, the radiation angle $\beta$ of the laser beam 313T relative to the insulating substrate 390T is selected to satisfy a relationship of $\beta=-\alpha$. Thereby, the insulating substrate 390T can be formed having a substantially perpendicular through-hole 395T.

Hence, similar to the first through-hole forming method, the second through-hole forming method can also significantly reduce the process time for forming through-holes in an insulating substrate.

Working Example

Next, working examples of the present invention are described. It is to be noted that the present invention is not limited to the below-described working examples.

Working Example 1

Multiple through-holes were formed in a dummy glass substrate by performing Step S210 of the second through-hole forming method by using the through-hole processing apparatus 400 of FIG. 6. Then, a discharging process was performed while moving the glass substrate at a same rate.

A glass substrate having a thickness of 0.3 mm was used.

A $CO_2$ laser was used as the laser source. The radiation power of the laser source was 50 W. The radiation time was 580 μs per through-hole.

The direct current discharge voltage was 5400 V, and the discharge time was 640 μs.

A total of 100 through-holes was formed with a pitch of 200 μm along a given row in a horizontal direction.

The moving rate of the glass substrate was 1.5 mm/sec. Further, the laser beam was radiated in a perpendicular direction relative to the glass substrate (i.e. radiation angle γ=0°).

After processing the glass substrate, the glass substrate was cut at its through-hole parts, and the inclination angles α of the through holes were measured. It is to be noted that the inclination angle α of the through-hole was calculated from the average values of the inclination angles of the 100 through-holes.

The calculated inclination angle α of the through-hole was −0.09°.

Working Example 2

In working example 2, 100 through-holes were formed in a glass substrate with a similar method as working example 1. However, in working example 2, the glass substrate was moved at a rate of 3.0 mm/sec. Conditions besides the moving rate of the glass substrate were the same as those of working example 1.

The measured inclination angle α of the through-hole after processing the glass substrate was −0.59°.

Working Example 3

In working example 3, 100 through-holes were formed in a glass substrate with a similar method as working example 1. However, in working example 3, the glass substrate was moved at a rate of 5.7 mm/sec. Conditions besides the moving rate of the glass substrate were the same as those of working example 1.

The measured inclination angle α of the through-hole after processing the glass substrate was −1.43°.

Working Example 4

In working example 4, 100 through-holes were formed in a glass substrate with a similar method as working example 1. However, in working example 4, the glass substrate was moved at a rate of 10 mm/sec. Conditions besides the moving rate of the glass substrate were the same as those of working example 1.

Figure 8:
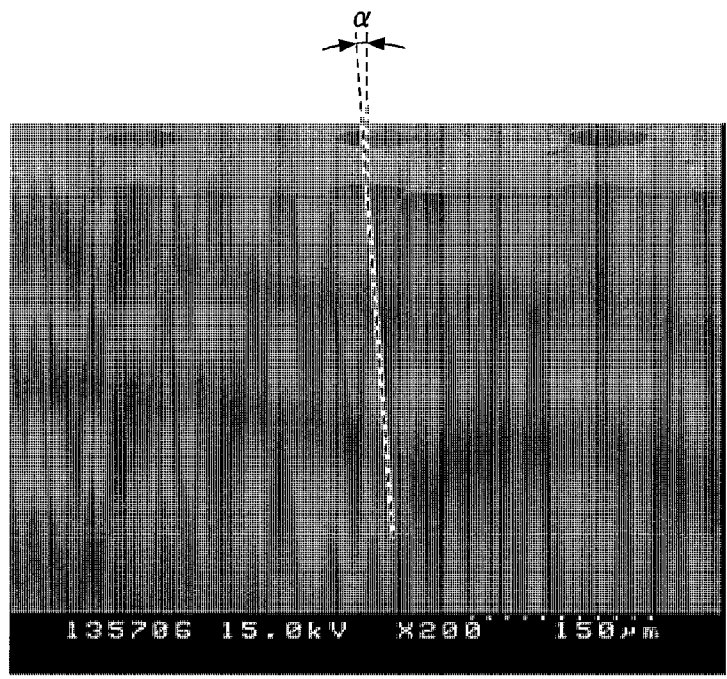
FIG. 8 is a cross-sectional view illustrating through-holes of a glass substrate processed by a working example 4.

FIG. 8 illustrates an example of a cross section of the through-hole after processing the glass substrate. The measured inclination angle α of the through-hole was −2.93°.

Working Example 5

Multiple through-holes were formed in a glass substrate by using a stop & go method with the through-hole processing apparatus 100 of FIG. 1.

The glass substrate was the same as the glass substrates used in working examples 1-4.

A $CO_2$ laser was used as the laser source. The radiation power of the laser source was 50 W.

After the forming of one through-hole was completed, the glass substrate was moved to another position to prepare for forming another through-hole. The time between the completion of the forming of the one through-hole and the completion of the preparation of forming the other through-hole was 200 ms.

A total of 100 through-holes was formed with a pitch of 200 μm along a given row in a horizontal direction.

After processing the glass substrate, the glass substrate was cut at its through-hole parts, and the inclination angles of the through holes were measured. The calculated inclination angle α of the through-hole was almost 0°.

The following table illustrates the main conditions for processing the through-holes of working examples 1-5, and the results of measuring the inclination angles α of the through-holes formed with the working examples 1-5.

TABLE 1

| EXAMPLE | METHOD | MOVING RATE (mm/sec) | INCLINATION ANGLE α (°) |
|---|---|---|---|
| 1 | NON-STOP MOVING METHOD | 1.5 | −0.09 |
| 2 | NON-STOP MOVING METHOD | 3.0 | −0.59 |
| 3 | NON-STOP MOVING METHOD | 5.7 | −1.43 |
| 4 | NON-STOP MOVING METHOD | 10 | −2.93 |
| 5 | STOP & GO METHOD | (200 msec)* | 0.00 |

Figure 9:
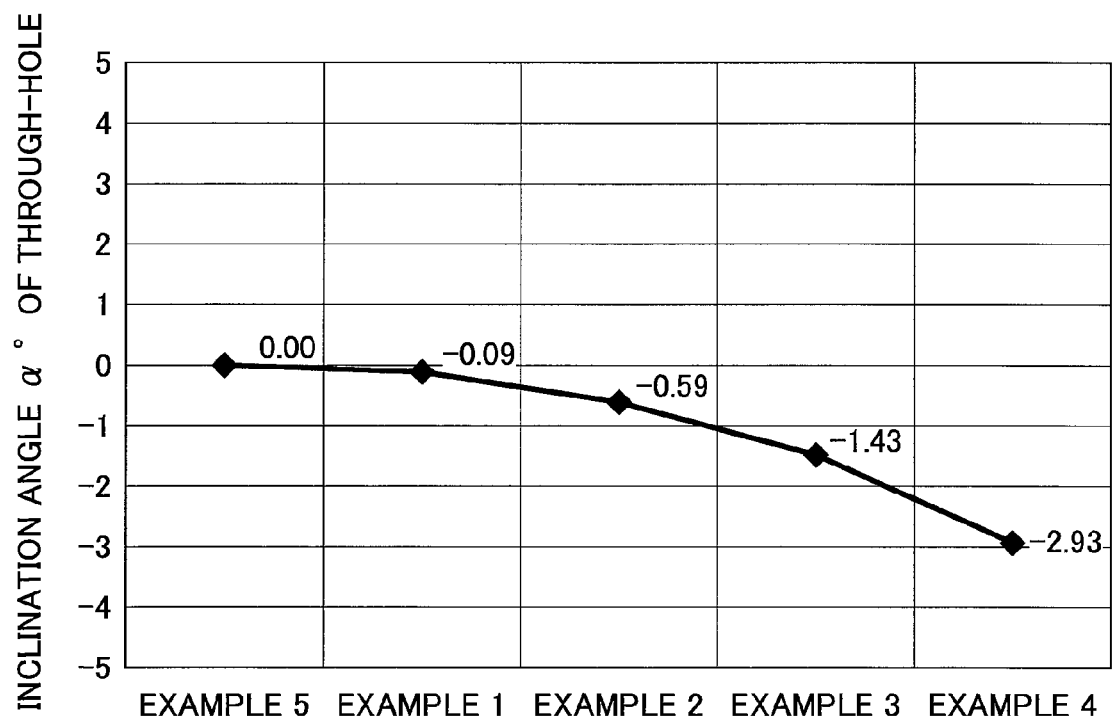
FIG. 9 is a graph illustrating a relationship between a moving rate of a glass substrate and an inclination angle $\alpha$ of a through-hole.

*The time between the completion of forming a first through-hole and the completion of preparing to form a second through-hole FIG. 9 is a graph illustrating results of measuring the inclination angles α of the through-holes of the working examples 1-5.

According to Table 1 and FIG. 9, it can be understood that substantially perpendicular through-holes are formed in the glass substrate with the working example 5 that uses the stop & go method. On the other hand, it can be understood that the absolute value of the inclination angle α of the through-hole becomes larger as the moving rate of the glass substrate increases in the working examples 1-4 that use the non-stop moving method.

Working Example 6

In working example 6, through-holes were formed in a glass substrate with a similar non-stop moving method as working example 2. However, in working example 6, the radiation angle β of the laser beam was set to +0.59°. That is, the radiation angle β of the laser beam was inclined toward the moving direction of the glass substrate at an angle of 0.59° relative to the line perpendicular to the first surface of the glass substrate. Conditions besides the radiation angle were the same as those of working example 2.

Figure 10:
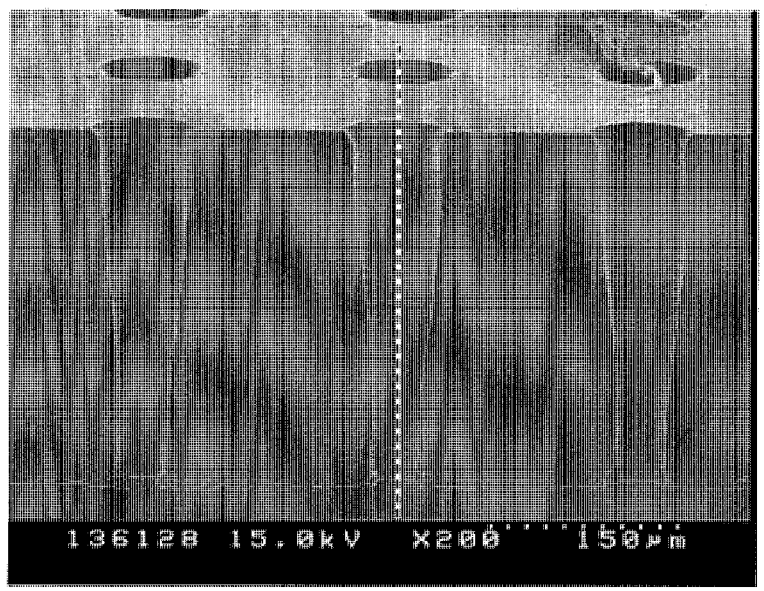
FIG. 10 is a cross-sectional view illustrating through-holes of a glass substrate processed by a working example 6.

FIG. 10 illustrates an example of a cross section of the through-hole after processing the glass substrate. The measured inclination angle α of the through-hole was almost 0°. Thus, the formed through-hole was substantially perpendicular to the glass substrate.

Accordingly, it was confirmed that through-holes that are substantially perpendicular to an insulating substrate can be formed even with the non-stop moving method by tilting a laser radiation direction at an angle of $\beta$ ($\beta=-\alpha$) relative to a line perpendicular to the insulating substrate when forming the through-holes with the non-stop moving method.

Further, the present invention is not limited to these embodiments, but various variations and modifications may be made without departing from the scope of the present invention.

The present application is based on and claims the benefit of priority of Japanese Priority Application No. 2013-191057 filed on Sep. 13, 2013, with the Japanese Patent Office, the entire contents of which are hereby incorporated by reference.

What is claimed is:

1. A method for forming a plurality of through-holes in an insulating substrate, the method comprising the steps of:
   a) forming a through-hole in a dummy insulating substrate including a first surface by radiating a laser beam to the first surface of the dummy insulating substrate in a state where the dummy insulating substrate is moved relative to the laser beam along a direction parallel to the first surface of the dummy insulating substrate;
   b) determining an inclination angle $\alpha$ ($-90° < \alpha < +90°$) of the through-hole relative to a line that is perpendicular to the first surface of the dummy insulating substrate; and
   c) forming a through-hole in the insulating substrate with the same conditions as step a) except for radiating a laser beam at an angle $\beta$ relative to a line that is perpendicular to a first surface of the insulating substrate, wherein the angle $\beta$ is set to be line symmetric with the inclination angle $\alpha$ relative to the line perpendicular to the first surface of the insulating substrate and satisfy a relationship of $\beta=-\alpha$.

2. The method as claimed in claim 1, wherein the inclination angle $\alpha$ satisfies a relationship of $|\alpha| \leq 20°$.

3. The method as claimed in claim 1,
   wherein step a) includes radiating the laser beam in a direction substantially perpendicular to the first surface of the dummy insulating substrate.

4. The method as claimed in claim 1,
   wherein the laser beam of step a) and the laser beam of step c) are radiated with substantially the same power,
   wherein the dummy insulating substrate of step a) and the insulating substrate of step c) have substantially the same thickness, and
   wherein the dummy insulating substrate of step a) and the insulating substrate of step c) are moved at substantially the same rate.

5. The method as claimed in claim 1, further comprising a step of:
   d) generating a direct current discharge by using a pair of electrodes provided on respective sides of the insulating substrate after performing step c).

* * * * *